(12) United States Patent
Moore et al.

(10) Patent No.: US 9,281,204 B2
(45) Date of Patent: Mar. 8, 2016

(54) METHOD FOR IMPROVING E-BEAM LITHOGRAPHY GATE METAL PROFILE FOR ENHANCED FIELD CONTROL

(71) Applicant: Freescale Semiconductor, Inc., Austin, TX (US)

(72) Inventors: Karen E. Moore, Phoenix, AZ (US); Bruce M. Green, Gilibert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/259,813

(22) Filed: Apr. 23, 2014

(65) Prior Publication Data

US 2015/0311084 A1 Oct. 29, 2015

(51) Int. Cl.

| H01L 21/461 | (2006.01) |
|---|---|
| H01L 21/285 | (2006.01) |
| H01L 29/40 | (2006.01) |
| H01L 29/423 | (2006.01) |
| H01L 29/66 | (2006.01) |
| H01L 29/778 | (2006.01) |
| H01L 29/20 | (2006.01) |

(52) U.S. Cl.
CPC .... *H01L 21/28587* (2013.01); *H01L 21/28581* (2013.01); *H01L 29/401* (2013.01); *H01L 29/42316* (2013.01); *H01L 29/66462* (2013.01); *H01L 29/7786* (2013.01); *H01L 29/2003* (2013.01)

(58) Field of Classification Search
CPC ............. H01L 21/0272; H01L 21/32139; H01L 21/3213
USPC ......... 438/666, 669, 738, 739, 670, 264, 749; 257/E21.305, E21.219, E21.229
See application file for complete search history.

(56) References Cited

U.S. PATENT DOCUMENTS

| 6,204,102 B1 * | 3/2001 | Yoon et al. ............... 438/182 |
|---|---|---|
| 7,319,070 B2 * | 1/2008 | Makiyama ............... 438/670 |
| 7,897,446 B2 | 3/2011 | Smorchkova et al. |
| 2006/0121658 A1 * | 6/2006 | Ahn et al. ............... 438/167 |
| 2007/0267655 A1 * | 11/2007 | Endoh et al. ............... 257/194 |
| 2008/0203541 A1 * | 8/2008 | Makiyama ............... 257/640 |
| 2013/0277680 A1 | 10/2013 | Green et al. |
| 2013/0341678 A1 | 12/2013 | Green et al. |
| 2013/0341679 A1 | 12/2013 | Green et al. |

OTHER PUBLICATIONS

A.S. Wakita et al., Novel high-yield trilayer resist process for 0.1 μm T-gate fabrication, J. Vac, Sci. Technol. B 13 (6) Nov./Dec. 1995.

\* cited by examiner

*Primary Examiner* — Julia Slutsker
(74) *Attorney, Agent, or Firm* — Terrile, Cannatti, Chambers & Holland, LLP; Michael Rocco Cannatti (57) ABSTRACT

A semiconductor device is provided which includes a GaN-on-SiC substrate (50-51) and a multi-layer passivation stack (52-54) in which patterned step openings (76) are defined and filled with gate metal layers using a lift-off gate metal process to form a T-gate electrode (74) as a stepped gate electrode having sidewall extensions and a contact base portion with one or more gate ledges.

12 Claims, 5 Drawing Sheets

METHOD FOR IMPROVING E-BEAM LITHOGRAPHY GATE METAL PROFILE FOR ENHANCED FIELD CONTROL

BACKGROUND OF THE INVENTION

1. Field of the Invention

The present invention is directed in general to integrated circuit devices and methods for manufacturing same. In one aspect, the present invention relates to the manufacture and use of field effect transistor devices.

2. Description of the Related Art

Semiconductor devices used in high-efficiency power amplifier (HEA) applications require higher speed and power handling capability. To meet these operating requirements, high power semiconductor devices may be formed with semiconductor materials, such as gallium nitride (GaN), having material properties that are suitable for use in such applications. For example, high speed transistor switch devices, such as high electron mobility transistor (HEMT) devices, formed with GaN-based materials offer many advantages in RF applications, especially in HEA applications, by delivering high current, high breakdown voltage, and high unity gate current cutoff frequency ($f_T$). However, as the speed of the devices is increased by shrinking the gate length and increasing the electron concentration in the device channel, gate and drain leakage currents can increase and device breakdown voltage can be reduced. Attempts to reduce gate leakage current in such devices may adversely affect other device properties. For example, device features and processing steps used to reduce leakage current can degrade the $f_T$ of the device by adding gate capacitance. In addition, the gate electrode device features at the edges of deep submicron gates can create electric fields which destabilize the wafer surface, impair the breakdown voltage, or otherwise produce surface damage that induces interface traps causing RF current collapse.

BRIEF DESCRIPTION OF THE DRAWINGS

The present invention may be understood, and its numerous objects, features and advantages obtained, when the following detailed description is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high frequency, high voltage semiconductor device, such as a gallium nitride field effect transistor device or diode, and associated fabrication process are described for providing enhanced field control at the edges of deep submicron gates by fabricating the gate metal profile to include a stepped field plate gate structure with a process that is integrated into an existing e-beam lithography flow. In selected embodiments, a Schottky gate electrode structure is formed with lower gate ledges and upper extensions by using a patterned multi-layer resist stack to define stepped openings in a multi-layer passivation surface stack in the course of etching a gate contact opening to expose the underlying gallium nitride substrate surface. During formation of the stepped field plate gate electrode structure, a multilayer dielectric stack ($Al_2O_3$/SiN/$Al_2O_3$) is sequentially deposited on a gallium nitride substrate wafer to form a dielectric passivation stack in which openings are etched to form gate and source/drain electrode structures in ohmic contact with the gallium nitride substrate. In selected embodiments, submicron gate electrode structures are patterned by forming a patterned tri-layer resist stack with a gate electrode opening on the dielectric passivation stack, such as by using e-beam lithography to pattern the gate electrode opening. The patterned tri-layer resist stack is then used to selectively remove part of the top layer (e.g., $Al_2O_3$) of the dielectric passivation stack with a first etch process (e.g., wet etch) to form a first opening in the top layer. Subsequently, a second etch process (e.g., dry etch) is performed to selectively remove the exposed portion of the next layer (e.g., SiN) with a process that laterally enlarges the opening in the bottom portion of tri-layer resist stack by a specified ledge width (e.g., 100-500 Angstroms). With the enlarged opening exposing part of the top layer of the dielectric passivation stack, the final etch process (e.g., wet etch) is applied to remove the bottom layer (e.g., $Al_2O_3$) of the dielectric passivation stack and to simultaneously remove the exposed portion of the top layer (e.g., $Al_2O_3$) of the dielectric passivation stack, thereby forming a stepped gate electrode opening in the dielectric passivation stack. Using the existing patterned tri-layer resist stack as a mold mask, one or more conductive gate metal layers are deposited as part of a lift-off gate metal process to form the gate electrode.

Applicants have determined that a need exists for improved semiconductor devices and associated fabrication processes to overcome the problems in the art, such as outlined above, though further limitations and disadvantages of conventional processes and technologies will become apparent to one of skill in the art after reviewing the remainder of the present application. For example, transistors formed with AlGaN/GaN hetero-structures enjoy high speed, high breakdown and low on-resistance because GaN has inherently high breakdown field strength and AlGaN/GaN hetero-junctions have very high electron sheet density. The high breakdown field strength and high electron sheet density arise from the relatively wide bandgap of GaN (3.4 eV) as compared to conventional semiconductor technologies such as Si (1 eV bandgap) and GaAs (1.6 eV bandgap).

Figure 1:
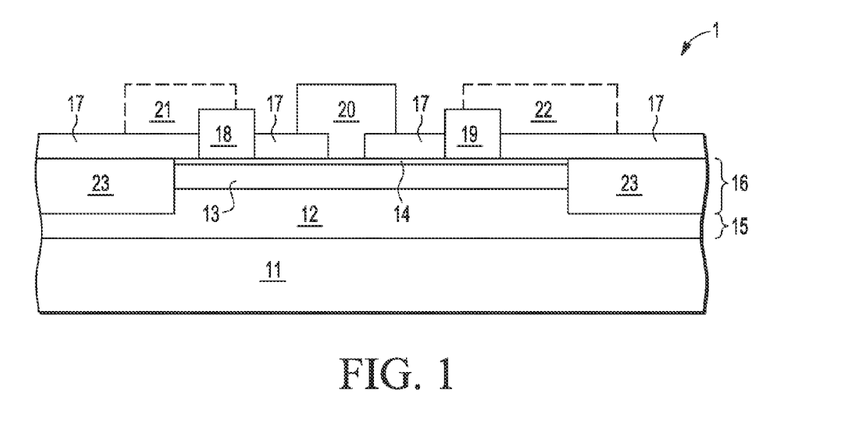
FIG. 1 is a simplified partial cross-sectional view of a field effect transistor employing a Schottky gate contact with sidewall extensions formed on an underlying dielectric passivation layer.

To illustrate an example GaN hetero-structure transistor device for simultaneously providing high breakdown voltage and high frequency capability, reference is now made to FIG. 1 which depicts a simplified partial cross-sectional view of a hetero-junction field effect transistor (HFET) device 1 showing the arrangement of various device regions. As depicted, the HFET device 1 is formed in a semiconductor substrate 11-14 which includes a host or base substrate layer 11 formed with an insulating layer, such as sapphire, Si, SiC, diamond, GaN. AlN and various other generally refractory materials. On the host/base substrate layer 11, a gallium nitride (GaN) buffer layer 12 and undoped $Al_xGa_{1-x}N$ barrier layer 13 are sequentially formed using a desired process, such as metal-organic chemical vapor deposition (MOCVD), molecular beam epitaxy (MBE), hydride vapor phase epitaxy (HVPE) or a combination thereof. In addition, a thin GaN cap or surface termination layer 14 may also be formed on the undoped $Al_xGa_{1-x}N$ barrier layer 13.

In an active island or mesa section 16 of the semiconductor substrate 11-14, an active island or mesa 16 is formed to extend from a lower portion 15 of the GaN buffer layer 12, where the electrically inactive insulating material in isolation regions 23 outside the mesa or island 16 provides device-to-device isolation and the lower portion 16 provides a transition zone for any crystalline imperfections at the interface with the host/base substrate 11. Over the semiconductor substrate, a passivation layer 17 is formed with a dielectric material (e.g., $Si_3N_4$, $SiO_2$, $SiO_xN_y$, AlN, $Al_2O_3$, $HfO_2$). The passivation layer 17 is formed with openings for various electrodes 18-20 for the HFET device 1. In particular, the source/drain electrodes 18-19 make contact through openings in the passivation layer 17 to connect source/drain regions (not shown) in the substrate to the conductive interconnections 21-22 for electrical coupling to various other devices or elements (not shown).

The mushroom or T-gate electrode 20 is formed in a gate opening of the passivation layer 17 with a short gate length contact base at the substrate surface with sidewall extensions formed directly on and adjacent to the underlying dielectric passivation layer 17. Though not shown, it will be appreciated that one or more previously formed gate dielectric layers may be exposed by the gate opening which were previously formed on the active device island or mesa in the intended channel regions using any desired deposition sequence, though the gate dielectric layer(s) are not necessarily formed on the active device islands(s) or mesa(s). However, by forming the gate electrode sidewall extensions directly on the dielectric passivation layer, additional parasitic capacitance is added to the HFET device 1, thereby impairing the device unity current gain cutoff frequency ($f_T$) and lowering the frequency capability. In addition, metal materials used to form the gate electrode 20 can react adversely with a SiN passivation layer 17, thereby increasing leakage current.

Figure 2:
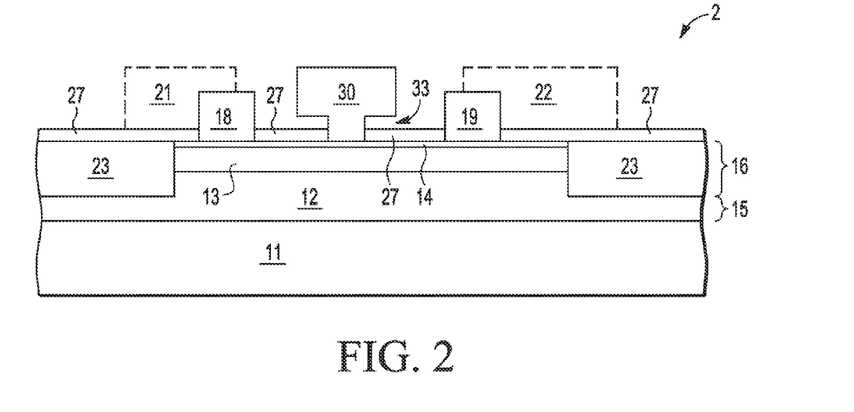
FIG. 2 is a simplified partial cross-sectional view of a field effect transistor employing a Schottky gate contact with sidewall extensions formed to be spaced apart from an underlying dielectric passivation layer.

To alleviate the problem of additional capacitance created by the gate electrode sidewall extensions, the sidewall extensions may be raised or moved away from the underlying passivation layer. An example is illustrated in FIG. 2 which depicts a simplified partial cross-sectional view of a heterojunction field effect transistor (HFET) device 2 having a semiconductor substrate 11-14 with a passivation surface layer 27 in which source/drain electrodes 18-19 and a raised T-shaped gate electrode 30 are formed. As depicted, the HFET device 2 and associated fabrication sequence is similar to the HFET device 1 shown in FIG. 1, except that the sidewall extensions of the gate electrode 30 are formed to be spaced apart from the underlying dielectric passivation layer 27. This spacing may be achieved by using a patterned multi-layer resist to form the raised T-shaped gate electrode 30 so that there is a vertical gap or space 33 which reduces the capacitance between the gate and source and gate and drain. Unfortunately, the depicted HFET device 2 will have higher gate leakage and poor pulsed current-voltage performance because the vertical gate gap 33 actually increases fields in the channel region at the drain edge of the gate. Such electric fields can destabilize the wafer surface, impair the breakdown voltage, or otherwise produce surface damage that induces interface traps causing RF current collapse. In addition, the profile of the raised T-shaped gate electrode 30 reduces the field control at wafer surface, leading to lower breakdown voltage performance.

Electric field problems created at the gate electrode sidewall edges may be reduced or eliminated according to embodiments of the present invention by forming the gate electrode structure with a stepped or ledged base portion and sidewall extensions on an upper portion, thereby reducing the electric field at the edges of the gate electrode structure in order to stabilize the wafer surface, improve breakdown voltage, and reduced current collapse. To illustrate an example fabrication sequence for forming a gate electrode structure that reduces leakage and ensures good high-voltage operation, reference is now made to FIGS. 3-12 which illustrate partial cross-sectional side views of various stages of fabricating a field effect transistor (FET) employing a Schottky gate contact structure in accordance with selected embodiments of the present disclosure. Though the illustrated transistor structures are illustrated in simplified form, it will be appreciated that the actual FET structures will not necessarily conform to simplified depictions, but will instead depend on the specific fabrication process(es) and/or structures used.

Figure 3:
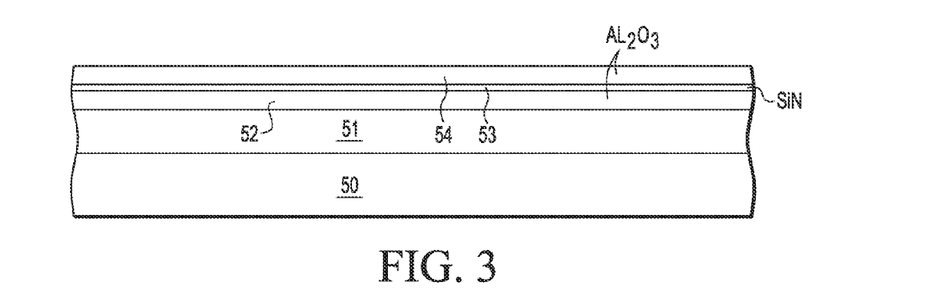
FIGS. 3-12 show cross-sectional views at different stages of fabricating a field effect transistor employing a Schottky gate contact structure in accordance with selected embodiments of the present disclosure.

At an initial manufacturing stage shown in the simplified partial cross-sectional view in FIG. 3 which depicts a wafer structure having a substrate with an epitaxial gallium nitride layer and a multilayer passivation stack. In an example embodiment, the wafer structure includes a host or base substrate layer 50. Depending on the type of transistor device being fabricated, the substrate layer 50 may be implemented as a bulk semiconductor substrate, an insulator substrate, a bulk metal substrate, a single crystalline silicon (doped or undoped) substrate, a poly-silicon substrate or other polycrystalline semiconductor substrate such as polycrystalline SiC, a semiconductor-on-insulator (SOI) substrate, a single or multi-layered composite film wafer substrate or any material including, for example, Si, SiC, SiGe, SiGeC, Ge, GaAs, InAs, InP, sapphire, diamond, GaN, or AlN, as well as other Group III-IV compound semiconductors or any combination thereof. With high frequency and high power applications, the substrate should have at least moderate thermal conductivity ($\kappa > 2$ W/cm-K) and have high electrical resistivity ($\rho > 10^4$ ohm-cm) or preferably semi-insulating ($\rho > 10^6$ ohm-cm) or even insulating ($\rho > 10^{12}$ ohm-cm) properties. For these reasons, SiC ($\kappa = 4$ W/cm-K, $\rho = 10^6$-$10^{11}$ ohm-cm) is the preferred choice, although for certain specific applications other substrates as discussed above may be used.

The wafer structure also includes an epitaxial substrate layer 51 formed (e.g., grown or deposited) on or over the substrate 50 to a predetermined thickness. The epitaxial substrate layer 51 may be implemented with gallium nitride (GaN) and/or aluminum nitride (AlN), or any alloys such as aluminum gallium nitride (AlGaN), indium gallium nitride (InGaN), and aluminum indium gallium nitride (AlInGaN). These materials are semiconductor compounds with strong chemical bonds that produce a wide, direct bandgap that provides a high breakdown field strength. Group III nitrides and their associated heterostructures (such as AlGaN/GaN, InAlN/GaN, InGaN/GaN, etc.) have a number of attractive properties including high electron mobility, high breakdown field strength, high electron sheet density, and others. Accordingly, group-III nitride materials are being widely investigated in many microelectronic applications such as transistors and optoelectronic devices. In selected embodiments, the substrate layer 51 may be formed with an epitaxial growth process that is seeded from a seed or nucleation layer (not shown) on the substrate 50 so that a single crystal epi substrate layer 51 is formed. In selected embodiments, the epitaxial substrate layer 51 is formed on surface of substrate 50 by, for example, Metal-Organo Chemical Vapor Deposition (MOCVD) or Molecular Beam Epitaxy (MBE), with MOCVD being preferred for GaN. As described herein and understood by those skilled in the art, the process of forming an epitaxial layer may be described as either depositing or growing a layer so that the "growth" and "deposition" terms are used interchangeably in this respect. As formed, the predetermined thickness of the epitaxial substrate layer 51 may be in the range of approximately 0.05 to 20 micrometers, preferably about 0.3 to 2 micrometers, but thicker and thinner layers may also be used. Though not shown, the wafer structure may also include an additional undoped $Al_xGa_{1-x}N$ barrier layer formed on the epitaxial substrate layer 51 using any desired technique (e.g., MOCVD, MBE, HVPE, or the like) to a predetermined thickness (e.g., approximately 50-400 Å, preferably about 50-250 Å) to form a hetero-junction. In addition, the wafer structure surface may be covered or terminated with GaN cap or surface termination layer (not shown) on the barrier layer using any desired technique (e.g., MOCVD, MBE, HVPE, or the like) to a predetermined thickness (e.g., approximately 5-80 Å).

On the wafer structure, a multi-layer passivation surface stack 52-54 is formed by sequentially depositing a plurality of different dielectric layers. For example, a first passivation layer 52 is formed with any desired insulating or dielectric material, such as $Al_2O_3$ (aluminum oxide), $Si_3N_4$ (silicon nitride), $SiO_2$, $SiO_xN_y$, AlN, and/or other suitable combinations or mixtures thereof. In selected embodiments, the first passivation layer 52 may be formed by depositing aluminum oxide on the surface of the GaN cap or surface termination layer 51 by low-pressure chemical vapor deposition (LPCVD), plasma enhanced chemical vapor deposition (PECVD), physical vapor deposition (PVD), atomic layer deposition (ALD), evaporation, sputtering or other well-known techniques. In selected embodiments, the first passivation layer 52 is formed using $Al_2O_3$ to a predetermined thicknesses (e.g., in the range of approximately 50 to 2000 Å, and more particularly about 50-150 Å), though other thicknesses and materials can be used. As will be appreciated, the choice of material for first passivation layer 52 will depend upon the choice of material for underlying substrate layers and the other materials used to form the multi-layer passivation surface stack 52-54, and may be selected to render the surface of the underlying substrate stable and having appropriate electrical properties (e.g., charged or neutral without significant surface states) during subsequent processing steps.

On the first passivation layer 52, a second passivation layer 53 may be formed by depositing a different dielectric material (e.g., $Si_3N_4$) by LPCVD, PECVD, PVD, ALD, evaporation, sputtering or other well-known techniques. In selected embodiments, the second passivation layer 53 is formed using LPCVD $Si_3N_4$ to a predetermined thicknesses (e.g., in the range of approximately 50 to 2000 Å, and more particularly about 50-150 Å), though other thicknesses and materials can be used. As will be appreciated, the choice of material for second passivation layer 53 will depend upon the choice of material for underlying substrate layers and the other materials in the multi-layer passivation surface stack 52-54, and may be selected to render the surface of the underlying substrate stable and having appropriate electrical properties (e.g., charged or neutral without significant surface states) during subsequent processing steps. In selected embodiments, the formation of the second passivation layer 53 by depositing a silicon nitride film 53 having a low hydrogen content (e.g., <10%) will prevent a leakage current path from forming at the multi-layer passivation surface stack and underlying substrate.

On the second passivation layer 53, a third passivation layer 54 may be formed by depositing a different dielectric material (e.g., aluminum oxide) by LPCVD, PECVD, PVD, ALD, evaporation, sputtering or other well-known techniques. In selected embodiments, the third passivation layer 54 is formed using $Al_2O_3$ to a predetermined thicknesses (e.g., in the range of approximately 50 to 2000 Å, and more particularly about 50-500 Å), though other thicknesses and materials can be used. As will be appreciated, the choice of material for third passivation layer 54 will depend upon the choice of material for underlying substrate layers and the other materials in the multi-layer passivation surface stack 52-54, and may be selected to render the surface of the underlying substrate to be stable and to have appropriate electrical properties (e.g., charged or neutral without significant surface states) during subsequent processing steps.

Figure 4:
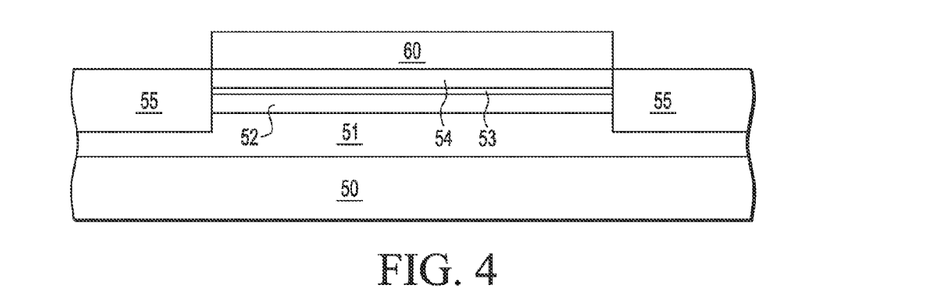

FIG. 4 illustrates processing of the semiconductor structure subsequent to FIG. 3 after isolation regions 55 are formed in the substrate 50-51 prior to ohmic contact formation. As illustrated, an implant mask 60 may be formed by depositing and patterning a layer of photoresist to define and expose the intended isolation regions 55 while covering and protecting the substrate 50-51 and passivation surface stack 52-54 in the active region area or "island." Alternatively, the implant mask 60 may be formed by depositing and selectively etching one or more mask layers (e.g., silicon nitride or silicon dioxide) over the passivation surface stack 52-54. However formed, the isolation regions 55 effectively define a mesa or island section for the active regions in the substrate 50-51. In selected embodiments, the isolation regions 55 may be formed by implanting any desired species of material into the exposed (unmasked) regions of the substrate 50-51 to generate defects (e.g., vacancies) and/or an amorphous crystal structure therein, including but not limited to implanting disruptive species (e.g., nitrogen ions, argon ions, helium ions, oxygen ions, or other suitable implant species) at a predetermined implant energy and dopant concentration (e.g., at least approximately $10^{11}$ atoms/cm$^2$) so as to form isolation regions 55 in an upper portion of the exposed (unmasked) regions of the substrate 50-51 where the implanted ions are incorporated into the structure of the isolation regions 55.

As formed, the isolation regions 55 electrically isolate the active region island to limit leakage current flow from outside the active region to conducting structures on the device mesa (s) or island(s) (e.g., gate and drain electrodes, contact pads of the source, drain and gate electrodes, and active regions of adjacent device(s) formed on the same substrate). As will be appreciated, the isolation regions 55 generally have an electrical isolation property with a sheet resistance of in the range of about $10^9$ ohms/□ for implanted isolation regions and in the range of $10^6$ ohms/□ for mesa isolated regions whose resistivity is limited by the resistivity of the GaN buffer that remains after mesa etching. When an implant process is used, the isolation regions 55 have a high vacancy concentration (e.g., greater than about $10^{18}$ to $10^{20}$ vacancies/cm$^3$) or crystalline defects which limits, or prevents, the transport of free carriers (e.g., electrons or holes) which contribute to the conductivity of the material. When a mesa isolation process is used, the removal of the active device channel leaves only the high resistivity buffer to conduct free carriers in the vicinity of the device. In the embodiments depicted hereafter, implant isolation is preferred, although in some situations, one may choose mesa etching or even a combination of mesa and implant isolation because of device requirements, the type of epitaxial wafer structure used, leakage requirements, equipment availability, cost, and other factors known to one with ordinary skill in the art.

Figure 5:
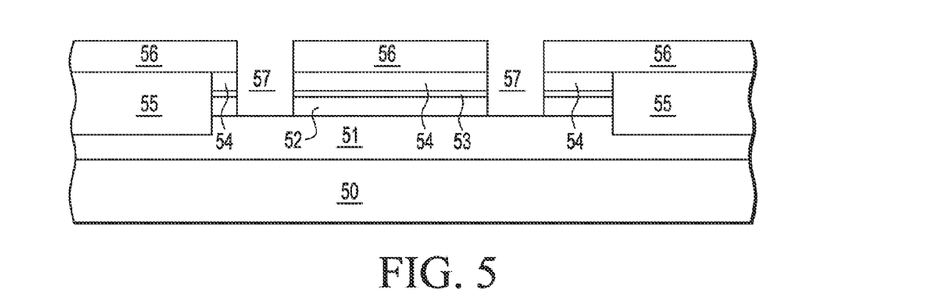

FIG. 5 illustrates processing of the semiconductor structure subsequent to FIG. 4 after source and drain contact openings 57 are formed with a selective etch mask 56 to remove portions of the passivation surface stack 52-54 and thereby expose the substrate 50-51. As a preliminary step, the isolation implant mask 60 is removed or stripped with an appropriate etch chemistry to leave the remnant passivation surface stack 52-54. Subsequently, a patterned etch mask 56 is formed, such as by depositing and patterning a layer of photoresist to define and expose source/drain contact openings 57 over the intended source/drain regions while otherwise protecting the substrate 50-51 and passivation surface stack 52-54 in the active region area. Depending on the number of type of layers formed in the passivation surface stack 52-54, one or more contact etch processes may be applied (such as wet etching, reactive-ion etching, ion beam etching, plasma etching, laser etching, or the like) to form the source/drain contact openings 57 to expose the substrate surface at the intended source and drain regions. In selected embodiments, the source and drain contact openings 57 are formed by using a patterned photoresist or etch mask layer 56 as an etch mask in combination with one or more suitable selective wet and dry etch process steps analogous to those described in connection with FIG. 10.

Figure 6:
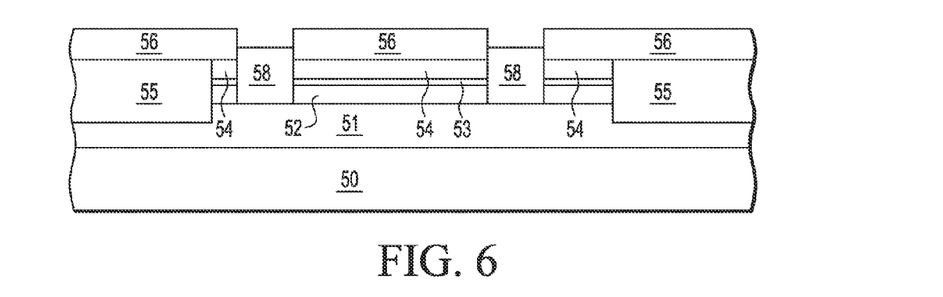

FIG. 6 illustrates processing of the semiconductor structure subsequent to FIG. 5 after one or more source/drain contact layers 58 are formed in contact openings 57. At this stage, the source/drain contacts 58 may be formed with any desired contact formation sequence, including but not limited to using a lift-off process which uses the same patterned photoresist or etch mask layer used to form source/drain contact openings 57. Alternatively, any desired metal deposition and masking and etching sequence may also be used to form the contacts 58 with one or more ohmic metal contact layers. When the substrate layer 51 is formed with GaN, the ohmic contacts 58 may be formed as layered TiAlMoAu or TiAlNiAu layers formed by evaporation with the Ti layer in contact with the GaN substrate surface, though other metal combinations and formation procedures can be used. Once formed, the ohmic contacts 58 may be annealed (e.g., at 700-900° C. for 10-120 sec) as one or more alloy layers to provide ohmic contact to the channel using any desired anneal process, such as a furnace or rapid thermal anneal (RTA), where the anneal can be performed at this step or at any other step in the process preceding the formation of the isolation implant regions. If desired, the implant isolation regions 55 may instead be formed after the ohmic anneal step. As will be appreciated, the formation of ohmic contacts depicted in FIGS. 5-6 is provided for illustration purposes, and the ohmic contacts may instead be formed at a different stage of fabrication, such as prior to the formation of the isolation regions 55 as depicted in FIG. 4.

After forming the source/drain contacts 58, a mushroom or T-shaped gate electrode having a base portion with stepped lower gate ledges is formed by defining stepped openings in the multi-layer passivation surface stack 52-54 in the course of etching a gate contact opening to expose the underlying gallium nitride substrate 51. To illustrate this sequence, reference is now made to FIG. 7 which illustrates processing of the semiconductor structure subsequent to FIG. 6 after a patterned opening 64 is developed in a multi-layer resist mask 62-63 to expose portions of the top layer 54 in the multi-layer passivation surface stack 52-54 for etching. As a preliminary step, the etch mask 56 (from FIG. 6) is removed or stripped with an appropriate etch chemistry to leave the remnant passivation stack 52-54 and contacts 58. Subsequently, a patterned multi-layer resist mask 61-63 is formed using any desired resist formation sequence. Generally speaking, each resist layer may be formed with a material that is formulated to be sensitive to charged particles, such as an electron sensitive resist film that is scanned with a focused beam of electrons to draw custom shapes on a surface covered with the electron sensitive resist film to change the solubility of the electron sensitive resist film so that either the exposed or non-exposed regions of the electron sensitive resist film may be selectively removed when immersed in a solvent. In selected example embodiments, an e-beam sensitive resist mask stack is formed by sequentially depositing a first or bottom resist layer 61 (e.g., α-methylstyrene and α-chloromethylacrylate copolymer (ZEP) or polymethylmethacrylate (PMMA) to a predetermined thickness (e.g., 50-200 nm), a second or middle resist layer 62 (e.g., poly(dimethylglutarimide) (PMGI)) to a predetermined thickness (e.g., 200-500 nm), and a third or top resist layer 63 (e.g., ZEP or PMMA) to a predetermined thickness (e.g., 50-200 nm).

Figure 7:
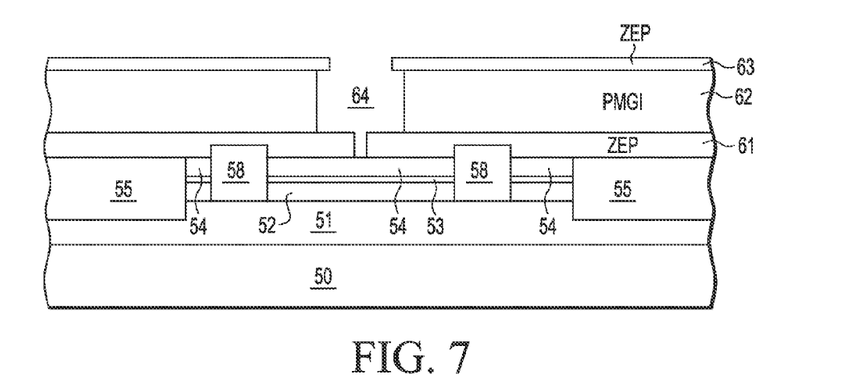

Using one or more exposure passes, the multi-layer resist mask 61-63 is patterned to define the opening 64 having a narrow bottom opening portion in the first/bottom resist layer 61, a wider middle opening portion in the second/middle resist layer 62, and an intermediate top opening portion in the third/top resist layer 63. As described more fully hereinbelow, the narrow bottom opening of the first/bottom resist layer 61 has a width that corresponds to the intended width of the gate electrode's base portion. In addition, the width of the wider middle opening portion in the second/middle resist layer 62 is sufficient to prevent any subsequently-deposited gate electrode metal layer(s) in the gate electrode opening from connecting to gate metal layer(s) formed on top of the third/top resist layer 63. Finally, the width of the intermediate top opening portion in the third/top resist layer 63 is selected to control the placement of the subsequently-deposited gate electrode metal layer(s) in the gate electrode opening. Depending on the number of type of layers formed in the multi-layer resist mask 61-63 and the desired shape of the opening 64, one or more e-beam resist developing processes may be applied (such as methyl isobutyl ketone and/or toluene) to form the patterned opening 64.

Figure 8:
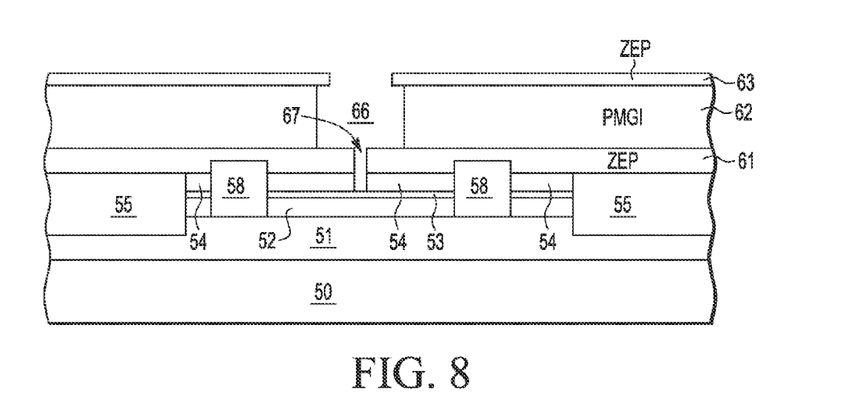

FIG. 8 illustrates processing of the semiconductor structure subsequent to FIG. 7 after the patterned multi-layer resist mask 61-63 is used to selectively etch exposed portions of the top passivation layer 54 in the multi-layer passivation surface stack 52-54, thereby forming a patterned opening 66 with a bottom portion 67 that exposes the underlying second passivation layer 53. At this stage, any suitable etch technique may be used to etch through the top passivation surface layer 54, such as inductively coupled plasma (ICP), electron-cyclotron resonance (ECR), or wet-etching. In selected embodiments where the top passivation surface layer 54 is formed with aluminum oxide, a wet etch chemistry is applied to expose the underlying second passivation layer 53. In addition, the selected etch process may be controlled to prevent any erosion or etching of the layers in the multi-layer resist mask 61-63.

Figure 9:
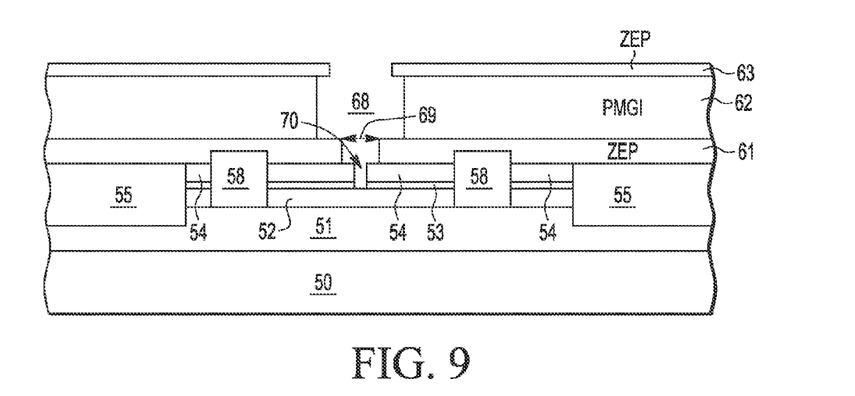

FIG. 9 illustrates processing of the semiconductor structure subsequent to FIG. 8 after the patterned multi-layer resist mask 61-63 is used to selectively etch exposed portions of the middle layer 53 in the multi-layer passivation surface stack 52-54, thereby forming a patterned opening 68 with a bottom portion 70 that exposes the underlying first passivation layer 52. At this stage, any suitable etch technique may be used to etch through the middle passivation surface layer 53, such as dry etching, inductively coupled plasma (ICP), electron-cyclotron resonance (ECR), or wet-etching. In selected embodiments where the second passivation surface layer 53 is formed with silicon nitride, the selected etch process is controlled to etch the second passivation surface layer 53 and expose the underlying first passivation layer 52, and to simultaneously laterally etch the exposed first/bottom resist layer 61. For example, a dry etch of the LPCVD SiN passivation layer 53 will not etch underlying $Al_2O_3$ passivation layer 52, but will "blow out" the resist profile for the bottom ZEP resist layer 61. The increased width 69 of the opening in the bottom ZEP resist layer 61 exposes a portion of the underlying $Al_2O_3$ passivation layer 54.

Figure 10:
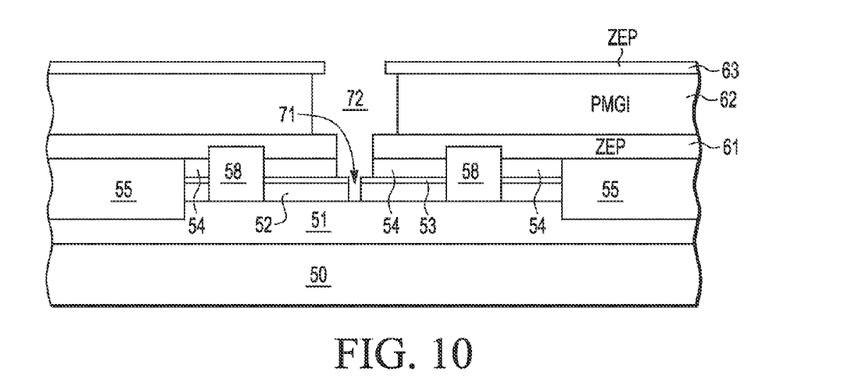

FIG. 10 illustrates processing of the semiconductor structure subsequent to FIG. 9 after the patterned multi-layer resist mask 61-63 is used to selectively etch exposed portions of the bottom passivation layer 52 in the multi-layer passivation surface stack 52-54, thereby forming a stepped gate electrode opening 72 with a bottom portion 71 that exposes the underlying substrate 51. At this stage, any suitable etch technique may be used to etch through the bottom passivation layer 52, such as inductively coupled plasma (ICP), electron-cyclotron resonance (ECR), or wet-etching. In selected embodiments where the bottom passivation layer 52 is formed with aluminum oxide, a wet etch chemistry is applied to simultaneously remove the exposed portions of the $Al_2O_3$ passivation layers 54, 52, thereby forming a stepped gate electrode opening 72 in the patterned multi-layer resist mask 61-63 that exposes the underlying GaN substrate layer 51.

As a result of the foregoing steps, a stepped gate electrode opening 72 is defined in the multi-layer passivation surface stack 52-54 in the course of etching a gate contact opening to expose the underlying gallium nitride substrate 51. In the stepped gate electrode opening 72, the bottom portion 71 formed in the first and second passivation layers 52-53 is narrower than the portion of the opening formed in the third passivation layer 54, effectively forming a staggered ledge or step gate profile having a specified ledge width (e.g., 100-500 Angstroms) above the bottom resist layer 61.

After forming the stepped gate electrode opening 72, a mushroom or T-shaped gate electrode is formed in the patterned multi-layer resist mask 61-63 and patterned multi-layer passivation surface stack 52-54 by filling the stepped gate electrode opening 72 with one or more gate metal layers. To illustrate this sequence, reference is now made to FIG. 11 which illustrates processing of the semiconductor structure subsequent to FIG. 10 after a gate electrode 74 is formed in the stepped gate electrode opening 72. Though not shown, it will be appreciated that one or more previously formed gate dielectric layers may be exposed by the stepped gate electrode opening 72 which were previously formed on the active device island or mesa in the intended channel regions using any desired deposition sequence, though the gate dielectric layer(s) are not necessarily formed on the active device islands(s) or mesa(s). Alternatively, the patterned gate electrode 74 may be formed after depositing one or more gate insulator layer or conductor layers (e.g., oxide, $Al_2O_3$, $HfO_2$ and/or metal layers) on the substrate structure 51 at the bottom of the stepped gate electrode opening 72, to form either HEMT, MESFET, MISFET or MOSFET devices.

Figure 11:
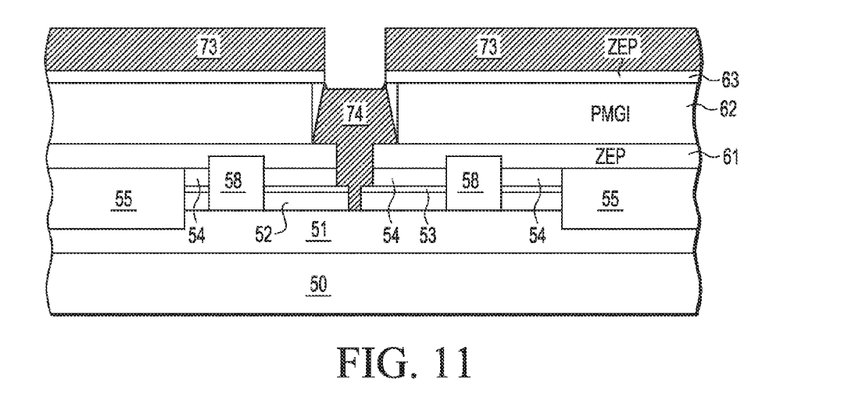

In selected embodiments, one or more initial gate Schottky contact layers (e.g., a Ni—Au or Pt—Au multi-layer) are formed or deposited in the stepped gate electrode opening 72 to provide a suitable gate contact for an underlying epi GaN substrate layer 51, such as by evaporating one or more metal layers 73-74 of approximately 200 to 400 Angstroms of Ni, Pd, Ir, Re, Cu, or Pt in the stepped gate electrode opening 72 and on the third/top resist layer 63 to provide the desired gate contact. In selected embodiments, Ni is preferred. This Schottky metal is surmounted by several thousand Angstroms of Au to provide lower resistance, but other metals, semi-metals, semiconductors and combinations thereof can also be used to form the gate contact. In addition or in the alternative, additional gate conductor layers, such as polysilicon, may be deposited in the stepped gate electrode openings 72, patterned and etched to form the final gate electrode 74. In some configurations, Pt, Pd, Ir, Re, or other suitable barrier metal may be used as a diffusion barrier layer between the Ni, Pd, Ir, Re, Cu, or Pt Schottky metal and Au to prevent Au from mixing with the Schottky metal.

As will be appreciated, the gate electrode 74 may be formed with any desired gate formation sequence, including but not limited to metal deposition and etching processes or a lift-off process wherein a gate metal (e.g., a metal comprising Ni and Au) is deposited on the tri-layer resist mask 61-63 and in the gate electrode openings 72 so that, when the resist mask 61-63 is removed (e.g., by standard resist strip solvent), only the gate electrode 74, remnant multi-layer passivation surface stack 52-54 and contacts 58 remain. By controlling the size and width dimensions of the stepped gate electrode opening 72, the gate metal layer 73 formed on top of the third/top resist layer 63 is not connected to the gate electrode 74 formed in the opening 72.

Figure 12:
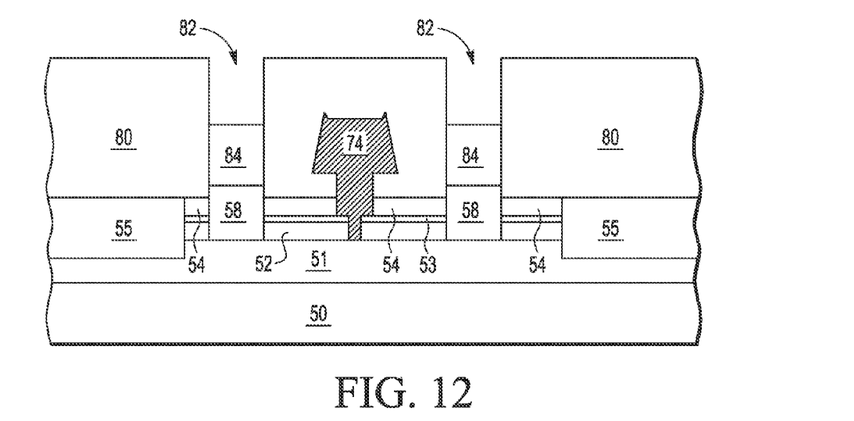

If desired, additional electrodes (such as source/drain electrodes or capacitor plates) can be formed separately. This is illustrated in FIG. 12 which depicts processing of the semiconductor structure subsequent to FIG. 11 after one or more first metal layers 84 are formed in openings 82 of a patterned mask layer 80. As a preliminary step, the patterned tri-layer resist mask 61-63 is removed or stripped with an appropriate etch chemistry to leave the gate electrode 74, remnant multi-layer passivation surface stack 52-54 and contacts 58. Subsequently, a patterned mask layer 80 may be formed by depositing and patterning a layer of photoresist with patterned openings 82 which expose the source/drain contact layers 58 while covering and protecting the gate electrode 74 and remnant multi-layer passivation surface stack 52-54 in the active region area. At this stage, the first metal layers 84 may be formed by depositing one or more "metal 1" layers on the patterned mask layer 80 and in the patterned openings 82. In selected embodiments, the first metal layers 84 may be formed with any desired metal formation sequence, including but not limited metal deposition and etching processes or a lift-off process wherein a metal is deposited on the mask 80 and in the patterned openings 82 so that, when the mask 80 is removed (e.g., by standard resist strip chemicals), only the gate electrode 74, remnant multi-layer passivation surface stack 52-54, contacts 58, and first metal layers 84 remain.

To connect the semiconductor structure to other circuitry, additional interconnect layers may be formed to complete the gate, source, and drain electrodes using any desired metallization, masking and etching steps. For example, back end of line (BEOL) processing may be performed to deposit one or more additional interlayer dielectric layers and metal interconnect structures to make electrical contact between the contacts and other circuitry.

Figure 13:
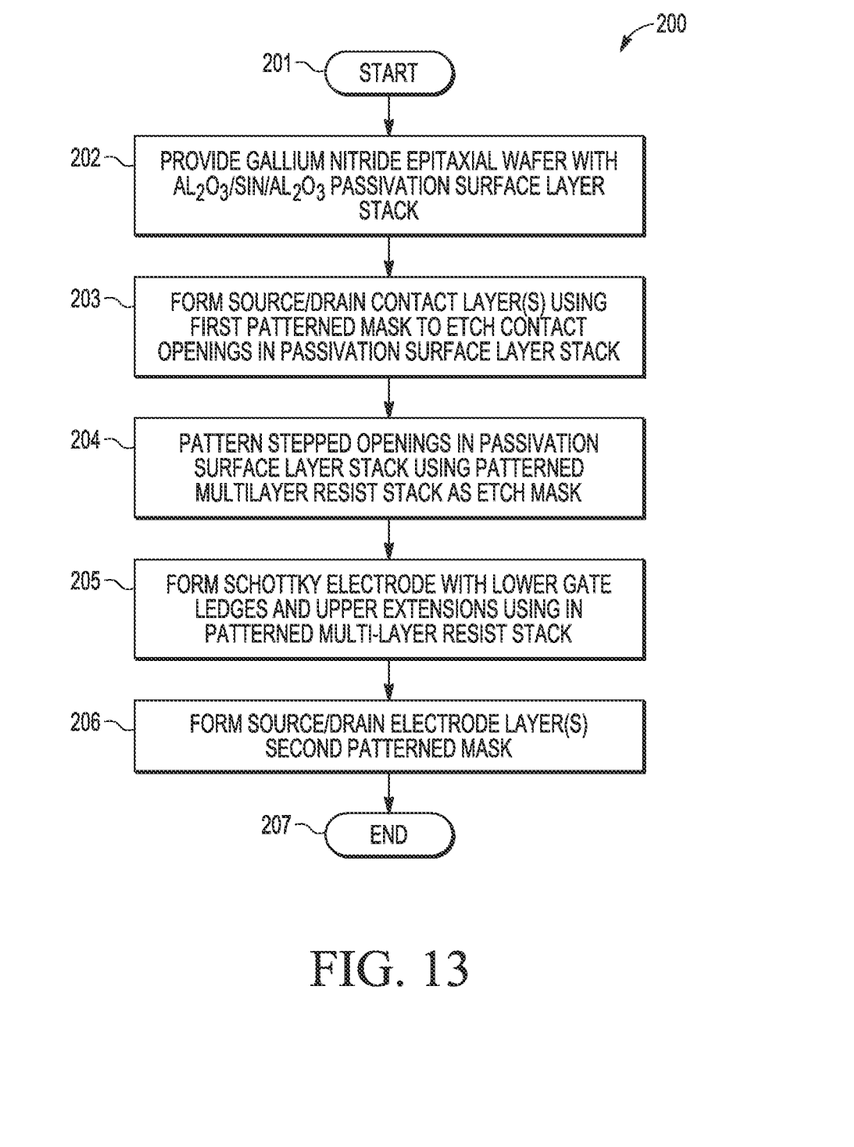
FIG. 13 is a simplified process flow chart illustrating various methods for fabricating devices in accordance with selected embodiments of the invention.

To further illustrated selected embodiments of the present invention, reference is now made to FIG. 13 which is a simplified process flow chart illustrating various methods for fabricating devices in accordance with selected embodiments of the invention. In describing the fabrication methodology

200, the description is intended merely to facilitate understanding of various exemplary embodiments and not by way of limitation. Unless otherwise indicated, subsequent steps may be provided in any desired order.

Once the fabrication methodology starts (step 201), a substrate layer is provided at step 202. In selected embodiments, the substrate layer may include a gallium nitride epitaxial wafer layer that is covered by an $Al_2O_3/SiN/Al_2O_3$ passivation surface layer stack using means well known in the art, though other substrate materials may instead be used. For example, the passivation surface layer stack may be formed by sequentially depositing a first thin (e.g., 50-500 nm) layer of aluminum oxide, a second thin (e.g., 50-500 nm) layer of LPCVD SiN, and a third thin (e.g., 50-500 nm) layer of aluminum oxide, though any desired insulating or dielectric material (e.g., $SiO_2$, $SiO_xN_y$, AlN, $Al_2O_3$) and deposition technique (e.g., conformal CVD, PECVD, PVD, ALD, HWCVD, CAT-CVD, ECR-CVD, ICP-CVD, evaporation, sputtering, etc.) could be used for the stacked layers, provided that exposed portions of the first and third layer can be anisotropically etched without also etching the second layer. In selected embodiments, the passivation surface layer stack includes one or more layers formed with a material that is selected to protect the substrate against gate etch damage and/or reduce leakage current in the finally formed device, such as by depositing an aluminum oxide etch stop layer on the substrate and then depositing a silicon nitride film having a low hydrogen content (e.g., <10%) to prevent a leakage current path from forming at the passivation surface layer stack and substrate surface. On the substrate, alignment marks may be formed using a Ti—Pt or other suitable material to provide suitable electron diffraction for e-beam alignment. In addition, isolation regions may be implanted using a photoresist implant mask which is subsequently stripped.

At step 203, a first patterned etch mask layer is formed to etch contact openings in the passivation surface layer stack in which source/drain contact layers are formed. For example, a patterned photoresist mask may be formed with etch contact openings which expose the passivation surface layer stack in the intended source/drain contact regions, followed by application of an anisotropic silicon nitride etch to remove the exposed regions of the passivation surface layer stack. Following one or more ohmic contact etch steps, ohmic metal is deposited and lifted off. The ohmic metal may then be annealed using a rapid thermal anneal heating step. In selected embodiments, the ohmic contacts may be formed by first applying a patterned etch mask layer to etch expanded contact openings in the passivation surface layer stack, and then subsequently forming a second patterned etch mask layer having contact openings exposing the substrate within the expanded contact openings in which source/drain contact layers are formed by depositing and lifting off a ohmic metal material.

At step 204, one or more stepped openings are patterned in the passivation surface layer stack using a patterned multi-layer resist stack as an etch mask. For example, a patterned tri-layer e-beam resist mask may be formed with etch contact openings which expose the passivation surface layer stack around the intended gate electrode region, followed by application of a wet etch chemistry to remove the exposed top $Al_2O_3$ passivation layer, followed by application of low power $SF_6$ dry reactive ion etch to remove the exposed regions of the middle LPCVD SiN passivation layer. The dry etch of the LPCVD SiN passivation layer is controlled so that the bottom $Al_2O_3$ passivation layer is not etched, but the resist profile of the bottom layer in the multi-layer resist stack is blown out or laterally receded to expose part of the top $Al_2O_3$ passivation layer. A final wet etch of the exposed bottom $Al_2O_3$ passivation layer exposes the substrate by completing the stepped opening in the passivation surface layer stack At step 205, a Schottky gate electrode is formed in the etch contact openings of the patterned multi-layer resist stack. For example, one or more gate metal layers may be evaporated on the patterned multi-layer resist stack to form a mushroom or T-shaped Schottky gate electrode in the etch contact openings. Subsequently, the Schottky gate electrode may be formed with a lift-off process wherein a gate metal (e.g., comprising Ni and Au) deposited on the patterned multi-layer resist stack is removed when the patterned multi-layer resist stack is removed (e.g., by standard resist strip solvent), leaving the Schottky gate electrode. As formed, the Schottky gate electrode includes lower gate ledges upper lateral extensions or wings which may extend over the underlying passivation surface layer stack.

At step 206, a second patterned mask layer is formed with etch openings exposing the source/drain contact layers. To this end, a patterned photoresist mask may be formed with etch openings which expose the source/drain contact layers. Subsequently, the source/drain electrode layers may be formed with a lift-off process wherein a first metal layer is deposited on the third patterned mask layer and in the etch openings so that, when the third patterned mask layer removed (e.g., by standard resist strip solvent), the source/drain electrode layers remain. At step 207, the process ends.

By now it should be appreciated that there is provided herein a semiconductor device (e.g., a diode or high frequency, high voltage, low leakage current gallium nitride transistor) and method for fabricating same. As disclosed, a substrate (e.g., a GaN/AlGaN/GaN substrate) is provided that is covered by a multi-layer dielectric or passivation stack. In selected embodiments, the multi-layer dielectric stack may be formed by sequentially depositing a bottom layer of aluminum oxide on the substrate/gallium nitride layer, a middle layer of silicon nitride on the bottom layer, and a top layer of aluminum oxide on the middle layer. Overlying the multi-layer dielectric stack, a multi-layer resist stack is patterned to define a first etch opening over the multi-layer dielectric stack, such as by applying one or more e-beam lithography steps to pattern the first etch opening in the multi-layer resist stack. In selected embodiments, the multi-layer resist stack is patterned by depositing a bottom resist layer on the multi-layer dielectric stack; depositing a middle resist layer on the bottom resist layer; depositing a top resist layer on the middle resist layer, exposing the resist layers with one or more exposure steps; and developing the top, middle, and bottom resist layers of the multi-layer resist stack with one or more developer steps to pattern the first etch opening which exposes a portion of the multi-layer dielectric stack for etching. In other embodiments, the patterned multi-layer resist stack is formed as a multi-layer e-beam gate electrode resist mask overlying the multi-layer dielectric stack with a gate electrode opening having a narrow bottom opening portion, wider middle opening portion, and narrow top opening portion. Using the resist stack, the multi-layer dielectric stack is etched with a plurality of different etch steps to form a stepped opening in the multi-layer dielectric stack which exposes the substrate/gallium nitride layer. In selected embodiments, the multi-layer dielectric stack is etched by applying a first wet etch process to remove a top aluminum oxide layer in the multi-layer dielectric stack that is exposed by the first etch opening; applying a reactive-ion etch process to remove a middle silicon nitride layer in the multi-layer dielectric stack that is exposed by the first etch opening and to laterally enlarge a bottom portion of the first etch opening, thereby exposing a portion of the top aluminum oxide layer; and applying a second wet etch process to remove a bottom aluminum oxide layer in the multi-layer dielectric stack that is exposed by the first etch opening and the exposed portion of the top aluminum oxide layer, thereby forming the stepped opening in the multi-layer dielectric stack. In other embodiments, the stepped opening in the multi-layer dielectric stack is formed by selectively removing a portion of a top dielectric layer in the multi-layer dielectric stack to expose a horizontal ledge of a middle dielectric layer in the multi-layer dielectric stack, where the horizontal ledge is between 100 and 500 Angstroms wide. In addition, a conductive gate electrode is formed in contact with a gate contact surface of the substrate and in the stepped opening to form a contact base portion with one or more gate ledges. In selected embodiments, the conductive gate electrode is formed with a contact base portion having a gate ledge contacting the horizontal ledge of the middle dielectric layer and gate electrode sidewall extensions that are vertically spaced above the gate ledge. As formed, the conductive gate electrode includes gate electrode sidewall extensions that are vertically spaced above the one or more gate ledges. In selected embodiments, the conductive gate electrode is formed by evaporating gate metal into the first etch opening and the patterned opening to form the conductive gate electrode having a contact base portion with one or more gate ledges in contact with the stepped opening and the gate contact surface of the substrate, and having gate electrode sidewall extensions that are vertically spaced above the one or more gate ledges. In this way, the conductive gate electrode is formed with a wider top portion and a narrower bottom portion.

In another form, there is provided a gallium nitride semiconductor device and associated method of fabricating same. In the disclosed methodology, a semiconductor substrate having a gallium nitride surface layer is provided, where the semiconductor substrate may be processed to form a mesa that is defined by an upper portion of the semiconductor that is thicker than a lower portion of the semiconductor and that is covered by the gallium nitride surface layer. In selected embodiments, the semiconductor substrate may be covered with a plurality of dielectric layers, such as by sequentially depositing a bottom aluminum oxide layer on the gallium nitride surface layer, a middle silicon nitride layer on the bottom aluminum oxide layer, and a top aluminum oxide layer on the middle silicon nitride layer. After covering the substrate with a plurality of dielectric layers, shallow trench isolation regions may be formed. In addition, a patterned multi-layer resist stack is provided that overlies the plurality of dielectric layers and that includes a mask opening located above the semiconductor substrate. The patterned multi-layer resist stack may be formed by forming a bottom resist layer on top of the plurality of dielectric layers; forming a middle resist layer on the bottom resist layer; forming a top resist layer on the middle resist layer; exposing the bottom resist layer, the middle resist layer, and the top resist layer with e-beam irradiation in the area of the mask opening; and applying one or more e-beam resist developing processes to form the mask opening in the patterned multi-layer resist stack. As formed, the mask opening includes a narrow bottom opening portion which exposes a top portion of the plurality of dielectric layers, a wider middle opening portion aligned over the narrow bottom opening portion, and a top opening portion that is aligned over and narrower than the middle opening portion. Using the patterned multi-layer resist stack as an etch mask, a portion of the top dielectric layer from the plurality of dielectric layers exposed by the narrow bottom opening portion of the patterned multi-layer resist stack is selectively etched to form a first opening in the top dielectric layer having a first width which exposes a middle dielectric layer from the plurality of dielectric layers. Subsequently, a portion of the middle dielectric layer from the plurality of dielectric layers exposed by the first opening is selectively etched to form a second opening in the middle dielectric layer having the first width which exposes a bottom dielectric layer from the plurality of dielectric layers while simultaneously widening the narrow bottom opening portion of the patterned multi-layer resist stack to expose an additional portion of the top dielectric layer. In addition, a portion of the bottom dielectric layer from the plurality of dielectric layers exposed by the second opening is selectively etched to form a third opening in the bottom dielectric layer having the first width which exposes a first portion of the gallium nitride surface layer while simultaneously widening the first opening in the top dielectric layer to form a wider first opening. Subsequently, a stepped field plate structure is formed in contact with at least part of the exposed first portion of the gallium nitride surface layer by filling the wider first opening, second opening, and third opening with one or more conductive layers, where the stepped field plate structure comprises a gate length contact base having a gate length and one or more gate ledges, and gate electrode sidewall extensions formed to be vertically spaced apart from the plurality of dielectric layers.

In yet another form, there is provided a semiconductor device and associated method of manufacture. As disclosed, the semiconductor device includes a substrate which may include a gallium nitride surface layer. Covering the substrate/gallium nitride layer, a multi-layer dielectric stack is formed (e.g., with a stacked bottom aluminum oxide layer, a middle silicon nitride layer, and a top aluminum oxide layer) with a stepped electrode opening defined by a lower dielectric layer opening which exposes the substrate/gallium nitride layer and a wider upper dielectric layer opening that is aligned with the lower dielectric layer opening. A conductive electrode is located at least in part in the stepped electrode opening to be in contact with the substrate/gallium nitride layer, where the conductive electrode includes a lower contact base portion having vertical sidewalls formed in the lower dielectric layer opening, a middle portion having vertical sidewalls formed in the wider upper dielectric layer opening, and upper electrode sidewall extensions formed to be vertically spaced above the multi-layer dielectric stack by a first vertical gap distance. As formed, the middle portion of the conductive electrode extends laterally past the lower contact base portion to form small step electrode features to provide enhanced field control. With the step electrode features providing enhanced field control, the conductive electrode does not include a passivation layer covering exposed sidewall surfaces of the conductive electrode. The conductive electrode may be formed with an evaporated gate metal which fills the lower dielectric layer opening and wider upper dielectric layer opening to form the lower contact base portion and middle portion, respectively, thereby forming a ledge in the middle portion which is vertically spaced above the substrate by a second vertical gap distance. In selected embodiments, the semiconductor device is a diode device formed with the gallium nitride layer and the conductive electrode. In other embodiments, the semiconductor device is a field effect transistor formed with the conductive electrode as a Schottky gate formed over the substrate.

Although the described exemplary embodiments disclosed herein are directed to high-frequency, low leakage devices and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to switch devices formed on GaN-based materials and SiC substrates, this is merely for convenience of explanation and not intended to be limiting and persons of skill in the art will understand that the principles taught herein apply to devices formed with different substrate materials. Accordingly, the identification of particular regions being formed with one type of material or another is merely by way of illustration and not limitation and other materials may be substituted in order to form devices. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device, comprising:
   providing a substrate;
   forming a multi-layer dielectric stack on the substrate;
   patterning a multi-layer resist stack on the multi-layer dielectric stack to define a first etch opening over the multi-layer dielectric stack;
   applying a first wet etch process to remove a top aluminum oxide layer in the multi-layer dielectric stack that is exposed by the first etch opening;
   applying a reactive-ion etch process to remove a middle silicon nitride layer in the multi-layer dielectric stack that is exposed by the first etch opening and to laterally enlarge a bottom portion of the first etch opening, thereby exposing a portion of the top aluminum oxide layer; and
   applying a second wet etch process to remove a bottom aluminum oxide layer in the multi-layer dielectric stack that is exposed by the first etch opening and the exposed portion of the top aluminum oxide layer, thereby forming a stepped opening in the multi-layer dielectric stack which exposes a gate contact surface of the substrate; and
   forming a conductive gate electrode in contact with the gate contact surface of the substrate and in the stepped opening to form a contact base portion with one or more gate ledges, the conductive gate electrode comprising gate electrode sidewall extensions that are vertically spaced above the one or more gate ledges.

2. The method of claim 1, where forming the multi-layer dielectric stack comprises sequentially depositing a bottom layer of aluminum oxide on the substrate, a middle layer of silicon nitride on the bottom layer, and a top layer of aluminum oxide on the middle layer.

3. The method of claim 1, where patterning the multi-layer resist stack comprises:
   depositing a bottom resist layer on the multi-layer dielectric stack;
   depositing a middle resist layer on the bottom resist layer;
   depositing a top resist layer on the middle resist layer;
   exposing the top resist layer, middle resist layer, and bottom resist layer with one or more exposure steps; and
   developing the top, middle, and bottom resist layers of the multi-layer resist stack with one or more developer steps to pattern the first etch opening which exposes a portion of the multi-layer dielectric stack for etching.

4. The method of claim 1, where patterning the multi-layer resist stack comprises applying one or more e-beam lithography steps to pattern the first etch opening in the multi-layer resist stack.

5. The method of claim 1, where forming the conductive gate electrode comprises:
   evaporating gate metal into the first etch opening and the patterned opening to form the conductive gate electrode comprising:
      the contact base portion with one or more gate ledges in contact with the stepped opening and the gate contact surface of the substrate, and
      gate electrode sidewall extensions that are vertically spaced above the one or more gate ledges.

6. The method of claim 1, where patterning a multi-layer resist stack comprises forming a multi-layer e-beam gate electrode resist mask overlying the multi-layer dielectric stack with a gate electrode opening having a narrow bottom opening portion, wider middle opening portion, and narrow top opening portion.

7. The method of claim 1, where the substrate comprises a gallium nitride layer formed on a top surface of the substrate.

8. The method of claim 1, where applying the first wet etch process removes a portion of the top aluminum oxide layer to expose a horizontal ledge of the middle silicon nitride layer in the multi-layer dielectric stack, where the horizontal ledge is between 100 and 500 Angstroms wide.

9. The method of claim 8, where forming the conductive gate electrode comprises forming a contact base portion with a gate ledge contacting the horizontal ledge of the middle dielectric layer and forming the gate electrode sidewall extensions that are vertically spaced above the gate ledge.

10. A method for forming a gallium nitride semiconductor device, comprising:
   providing a semiconductor substrate comprising a gallium nitride surface layer;
   covering the semiconductor substrate with a plurality of dielectric layers;
   providing a patterned multi-layer resist stack overlying the plurality of dielectric layers with a mask opening located above the semiconductor substrate, the mask opening comprising a narrow bottom opening portion which exposes a top portion of the plurality of dielectric layers, a wider middle opening portion aligned over the narrow bottom opening portion, and a top opening portion that is aligned over and narrower than the middle opening portion;
   etching through a top dielectric layer from the plurality of dielectric layers exposed by the narrow bottom opening portion of the patterned multi-layer resist stack with a first wet etch process to form a first opening in the top dielectric layer having a first width which exposes a middle dielectric layer from the plurality of dielectric layers;
   etching through the middle dielectric layer from the plurality of dielectric layers exposed by the first opening with a reactive ion etch process to form a second opening in the middle dielectric layer having the first width which exposes a bottom dielectric layer from the plurality of dielectric layers while simultaneously widening the narrow bottom opening portion of the patterned multi-layer resist stack to expose an additional portion of the top dielectric layer;
   etching through the bottom dielectric layer from the plurality of dielectric layers exposed by the second opening with a second wet etch process to form a third opening in the bottom dielectric layer having the first width which exposes a first portion of the gallium nitride surface layer while simultaneously widening the first opening in the top dielectric layer to form a wider first opening;
   forming a stepped field plate structure in contact with at least part of the exposed first portion of the gallium nitride surface layer by filling the wider first opening, second opening, and third opening with one or more conductive layers, where the stepped field plate structure comprises a gate length contact base having a gate length and one or more gate ledges, and gate electrode sidewall extensions formed to be vertically spaced apart from the plurality of dielectric layers.

11. The method of claim 10, where providing the patterned multi-layer resist stack comprises:
   forming a bottom resist layer on top of the plurality of dielectric layers;
   forming a middle resist layer on the bottom resist layer;
   forming a top resist layer on the middle resist layer;
   exposing the bottom resist layer, the middle resist layer, and the top resist layer with e-beam irradiation in the area of the mask opening; and
   applying one or more e-beam resist developing processes to form the mask opening in the patterned multi-layer resist stack.

12. The method of claim 11, where covering the semiconductor substrate with a plurality of dielectric layers comprises sequentially depositing a bottom aluminum oxide layer on the gallium nitride surface layer, a middle silicon nitride layer on the bottom aluminum oxide layer, and a top aluminum oxide layer on the middle silicon nitride layer.

* * * * *